(12) United States Patent
Suh et al.

(10) Patent No.: US 8,875,363 B2
(45) Date of Patent: Nov. 4, 2014

(54) THIN FILM CAPACITORS ON METAL FOILS AND METHODS OF MANUFACTURING SAME

(75) Inventors: Seigi Suh, Cary, NC (US); Esther Kim, Cary, NC (US); William J. Borland, Chapel Hill, NC (US); Christopher Allen Gross, Raleigh, NC (US); Omega N. Mack, Durham, NC (US); Timothy R. Overcash, Apex, NC (US)

(73) Assignee: CDA Processing Limited Liability Company, Wilmington, DE (US)

( * ) Notice: Subject to any disclaimer, the term of this patent is extended or adjusted under 35 U.S.C. 154(b) by 1623 days.

(21) Appl. No.: 12/237,409

(22) Filed: Sep. 25, 2008

(65) Prior Publication Data

US 2010/0073845 A1    Mar. 25, 2010

(51) Int. Cl.
H01G 7/00 (2006.01)
H05K 1/16 (2006.01)
H01G 13/00 (2013.01)
H01G 4/12 (2006.01)

(52) U.S. Cl.
CPC ............... H01G 4/12 (2013.01); H05K 1/162 (2013.01); H05K 2203/1126 (2013.01); H01G 13/00 (2013.01); H05K 2201/0195 (2013.01); H05K 2201/0175 (2013.01); H05K 2201/0355 (2013.01)
USPC ............. 29/25.42; 29/25.41; 29/831; 29/842; 29/846; 29/851; 427/79

(58) Field of Classification Search
USPC ............. 29/25.41, 25.42, 831, 842, 846, 851; 427/79, 80, 81
See application file for complete search history.

(56) References Cited

U.S. PATENT DOCUMENTS

| | | | | |
|---|---|---|---|---|
| 5,006,363 | A | * | 4/1991 | Fujii et al. ...................... 427/571 |
| 5,097,391 | A | * | 3/1992 | Nomura et al. ............. 361/321.4 |
| 5,593,495 | A | * | 1/1997 | Masuda et al. ..................... 117/4 |
| 5,783,253 | A | * | 7/1998 | Roh ................................ 427/81 |
| 7,011,726 | B1 | * | 3/2006 | Palanduz ................... 156/89.18 |
| 7,029,971 | B2 | | 4/2006 | Borland et al. |
| 2002/0092356 | A1 | * | 7/2002 | Yamamoto et al. ............. 73/754 |
| 2008/0316723 | A1 | | 12/2008 | Borland et al. |
| 2009/0035913 | A1 | | 2/2009 | Bao et al. |
| 2009/0238954 | A1 | | 9/2009 | Suh et al. |

OTHER PUBLICATIONS

F. D. Richardson et al., The Thermodynamics of Substances of Interest in Iron and Steel Making From O C to 2400 C, J. Iron Steel Inst., 1948, vol. 160:261-270.
Seigi Suh et al., Large Area Thin Film Capacitors on Metal Foils and Methods of Manufacturing Same, U.S. Appl. No. 12/051,931, filed March 3, 2008.

* cited by examiner

*Primary Examiner* — Peter DungBa Vo
*Assistant Examiner* — Jeffrey T Carley

(57) ABSTRACT

Disclosed are methods of making a dielectric on a metal foil, and a method of making a large area capacitor that includes a dielectric on a metal foil. A first dielectric layer is formed over the metal foil by physical vapor deposition, and a dielectric precursor layer is formed over the first dielectric layer by chemical solution deposition. The metal foil, first dielectric layer and dielectric precursor layer are prefired at a prefiring temperature in the range of 350 to 650° C. The prefired dielectric precursor layer, the first dielectric layer and the base metal foil are subsequently fired at a firing temperature in the range of 700 to 1200° C.

20 Claims, 10 Drawing Sheets

THIN FILM CAPACITORS ON METAL FOILS AND METHODS OF MANUFACTURING SAME

TECHNICAL FIELD

The present invention pertains to capacitors that can be embedded in printed wiring boards, and more particularly to capacitors that include a thin film dielectric formed on a metal foil.

RELATED ART

A high capacitance density, thin-film ceramic capacitor can be embedded in a printed wiring board (PWB) package onto which an integrated circuit (IC) is mounted. A single layer ceramic capacitor directly under the IC can reduce the inductance and provide the capacitance necessary to satisfy the IC requirements. Such a capacitor in the PWB can provide capacitance at a significantly quicker response time and lower inductance than surface mounted capacitors.

Embedment of high capacitance, ceramic thin-film capacitors in printed wiring boards is known. Capacitors are initially formed on metal foils by depositing a capacitor dielectric material on the foil and firing it at an elevated temperature. A top electrode is formed on the dielectric to form a fired-on-foil capacitor structure. The foil is then bonded to an organic printed wiring board structure and further processed to create individual capacitors embedded in the printed wiring board. The printed wiring board may have additional layers and processing to form the final multi-layer board.

Once the capacitors are embedded, however, they cannot be replaced like conventional surface mounted capacitors. Accordingly, 100% embedded capacitor yield is required for each printed wiring board to function as designed. If one embedded capacitor in the printed wiring board does not function, the board has to be discarded. Achieving 100% embedded capacitor yield is especially troublesome where it is desirable for a large number of embedded capacitors to occupy the area under or proximate a semiconductor such as an IC mounted on the PWB. A single IC may require hundreds of embedded capacitors. U.S. patent application Ser. No. 11/765,113 discloses that large area capacitors on foil, where each capacitor is essentially equivalent in size to the printed circuit board, can be fabricated, tested and only foil containing "known good" capacitors bonded to the printed wiring board. A known good large area capacitor can subsequently be divided up into multiple capacitor units, as for example, by patterning the conductive layers of the known good large area capacitor by etching. One hundred percent of the multiple individual capacitor units that result will also be good because they are made from the division of a known good large area capacitor. This is especially useful for printed wiring boards that are relatively small, such as interposer devices, where dimensions are in the order of 10 mm by 10 mm to 30 mm by 30 mm.

High capacitance density may be achieved by use of a thin dielectric with a high permittivity or dielectric constant (K). High dielectric constant thin-films of less than 1 micrometer in thickness can be deposited onto a metal foil by sputtering, laser ablation, chemical vapor deposition, and chemical solution deposition. Ceramic thin-film capacitors in which a dielectric layer is deposited on a metal foil by sputtering is disclosed in U.S. patent application Ser. No. 11/832,995. Initial deposition is either amorphous or crystalline depending upon deposition conditions. Amorphous compositions have relatively low K (approximately 20) and have to be fired at high temperatures to induce crystallization and produce the desired high K phase. The high K phase in barium titanate based dielectrics can be achieved when grain sizes exceed 0.1 micron and so firing temperatures as high as 900° C. or higher may be used.

High temperature annealing of barium titanate thin films formed on base metal foils such as copper or nickel, require low oxygen partial pressures to avoid oxidation of the metal. The low oxygen partial pressures, however, often result in low insulation resistance in barium titanate based compositions due to reduction of the dielectric material. Use of acceptor doping or of a subsequent re-oxidation procedure has been used to improve insulation resistance. However, for a given dielectric thickness, insulation resistance is inversely proportional to the common electrode area of the capacitor. Thus, larger area capacitors have lower insulation resistance.

Chemical solution deposition (CSD) and sputtering techniques for fired-on-foil thin-film capacitor fabrication for embedment into printed wiring boards are disclosed in U.S. Pat. No. 7,029,971 and U.S. patent application Ser. No. 12/051,931. CSD techniques are desirable due to their simplicity and low cost. However, the fabrication of large area CSD thin-film capacitors on metal foil has been limited by the defect density in the dielectric thin-film caused, for example, by the presence of cracks, porosity, voids, and pinholes. Such defects have limited the size of such capacitors to less than approximately one to three $mm^2$. Defects in the dielectric may form as a result of a variety of reasons, such as, for example, the effect of the underlying metal foil, dust particles in the fabrication area, inadequate densification of the dielectric, and defects or vacancies in the molecular structure. A high level of densification of the dielectric wherein any porosity in the film is isolated, is generally accepted as being required to achieve high yield in large area capacitors. Firing a CSD dielectric precursor deposit on metal foil, however, restricts the shrinkage of the dielectric to the "z" or vertical dimension when sintering takes place. This and the high level of refractoriness exhibited by high dielectric constant materials, makes achieving functioning large area capacitors wholly derived from CSD processing difficult. There is a need for process by which large numbers of embedded capacitor units can be obtained with excellent capacitance and insulation resistance as well as very high yield.

SUMMARY

A method of forming a dielectric is disclosed. The disclosed method comprises the steps of providing a metal foil, forming a first dielectric layer over the base metal foil by physical vapor deposition (PVD) methods, and forming a dielectric precursor layer over the first dielectric layer by chemical solution deposition (CSD) methods. The metal foil, first dielectric layer and dielectric precursor layer are prefired at a prefiring temperature in the range of 350 to 650° C. The prefired dielectric precursor layer, the first dielectric layer and the metal foil are subsequently fired at a firing temperature in the range of 700 to 1200° C. In one embodiment of the disclosed method, the firing results in a dielectric comprising crystalline barium titanate or crystalline barium strontium titanate.

In one embodiment of the disclosed method, the first dielectric layer is deposited on the metal foil by sputtering.

In another embodiment, the first dielectric layer is fired at a firing temperature in the range of 700 to 1200° C. prior to formation of the dielectric precursor layer onto the first dielectric layer.

In another disclosed embodiment, the prefiring of the dried dielectric precursor layer may be undertaken in an air or a moist reducing atmosphere. The moist reducing atmosphere may comprise moist $H_2$ and/or CO.

In another embodiment of the disclosed method, after prefiring the dielectric precursor layer, an additional dielectric precursor layer is formed over the prefired dielectric precursor layer, and the additional dielectric precursor layer is prefired at a temperature in the range of 350 to 650° C.

In another embodiment of the method disclosed, forming the dielectric precursor layer over the first dielectric layer comprises the steps of coating a layer of a dielectric precursor solution onto the first dielectric layer, drying the layer of dielectric precursor solution at a temperature between 150 and 300° C. to form a dried dielectric precursor layer, coating an additional dielectric precursor solution layer over the dried dielectric precursor layer, and drying the additional dielectric precursor solution layer at a temperature between 150 and 300° C. to form an additional dried dielectric precursor layer over the dried dielectric precursor layer.

In another disclosed embodiment, the firing of the prefired dielectric precursor layer, the first dielectric layer and the metal foil is undertaken under a reducing atmosphere.

Also disclosed is a method for making a capacitor. According to the disclosed method, a dielectric is formed on a metal foil by physical vapor deposition as described above, and a second conductive layer is formed over the dielectric, wherein the metal foil, the dielectric, and the second conductive layer form the capacitor. The area of the capacitor made according to the disclosed method may be greater than 80 $mm^2$, and may be greater than 400 $mm^2$, and may even be greater than 2500 $mm^2$.

BRIEF DESCRIPTION OF THE DRAWINGS

According to common practice, the various features of the drawings discussed below are not necessarily drawn to scale. Dimensions of various features and elements in the drawings may be expanded or reduced to more clearly illustrate the embodiments of the invention. The detailed description will refer to the following drawings, wherein like numerals refer to like elements, and wherein.

DETAILED DESCRIPTION

Definitions

Figure 1:
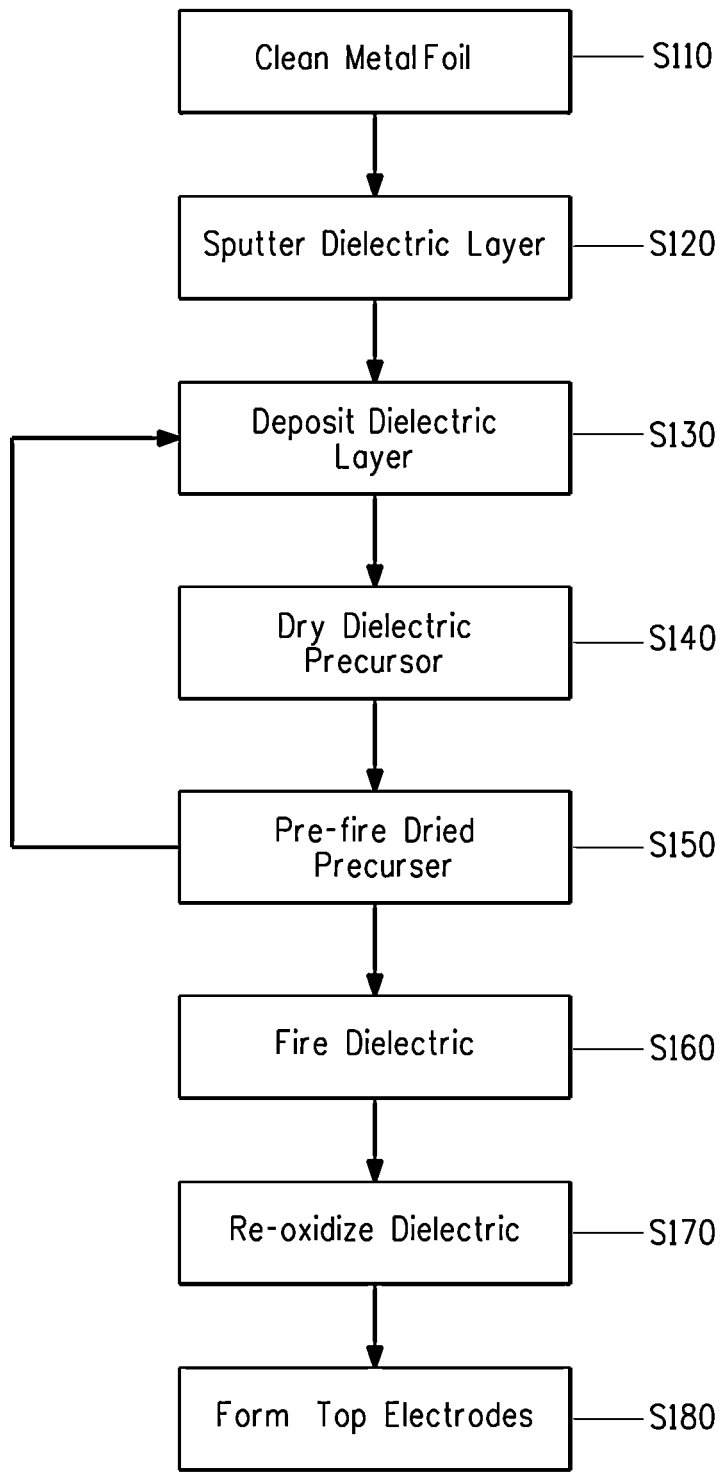
FIG. 1 is a block diagram of a method suitable for forming a capacitor on metal foil according to the methods disclosed herein.

The following definitions are used herein to further define and describe the disclosure.

As used herein and recited in the claims, the term "a" includes the concepts of "at least one" or "one or more than one".

As used herein, "drying" refers to removing the solvent from a deposited dielectric precursor solution. Drying may be achieved by heating the deposited precursor solution to effect solvent removal, as for example by heating the deposited precursor solution to a temperature of approximately between 100° C. and 300° C.

As used herein, "base metal foil" refers to metal foils that do not comprise precious metal and as such, will oxidize if subjected to elevated temperatures under ambient conditions, as for example foils comprised of copper, nickel, and alloys of copper and nickel.

As used herein, "prefiring" refers to heating the dielectric precursor layers up to a temperature of between approximately 350° C. and 650° C. and then holding such temperature for about 5 to 40 minutes to remove the organic content of the dried dielectric precursor by decomposition, hydrolysis and/or pyrolysis.

As used herein, the terms "high dielectric constant", "high Dk" and "high permittivity" are interchangeable and refer to dielectric materials that have a bulk dielectric constant above 500.

As used herein, the terms "firing", "annealing" and "sintering" are interchangable and refer to processing a dielectric or a dielectric precursor material at an elevated temperature, such as a temperature greater than 700° C.

As used herein, the terms "re-oxygenating" the dielectric and "re-oxidizing" the dielectric are interchangeable and refer to processing the dielectric at a temperature that is below that used for firing the dielectric in an atmosphere that is richer in oxygen than that used in the firing process.

As used herein, "capacitance density" refers to the measured capacitance of the capacitor divided by the common area of the electrodes of the capacitor. Capacitance density is related to the dielectric constant by the relationship:

$$C/A = 0.885\, K/t$$

where C/A is the capacitance density in nano Farads (nF) divided by the common electrode area expressed in square centimeters ($cm^2$); K is the dielectric constant; t is the dielectric thickness in micrometers (microns); and 0.885 is a constant (permittivity of free space).

As used herein, "embedded" refers to incorporating an electronic part, such as a capacitor, into a printed wiring board.

Described herein is a method of making a dielectric on a metal foil. Also described is a method of making a capacitor that includes a dielectric on a metal foil. Also described herein is a method of making a large area fired-on-foil capacitor with a high capacitance density, relatively low dissipation factor and a high insulation resistance. Foils containing large area capacitors constructed according to the method disclosed herein can be bonded to an organic printed wiring board structure and further processed to create individual capacitors embedded in the printed wiring board at 100% yield.

Disclosed is a method of making a dielectric, comprising the steps of providing a metal foil, forming a first dielectric layer over the base metal foil by physical vapor deposition (PVD) methods, and forming a dielectric precursor layer over the first dielectric layer by chemical solution deposition (CSD) methods. The metal foil, first dielectric layer and dielectric precursor layer are prefired at a prefiring temperature in the range of 350 to 650° C. Prefiring may be accomplished in a moist reducing atmosphere having a relative humidity of at least 50% and an oxygen partial pressure of less than about $10^{-6}$ atmospheres or in air depending on the type of metal foil. The prefired dielectric precursor layer, the first dielectric layer and the metal foil are subsequently fired at a firing temperature in the range of 700 to 1200° C. Depending upon the composition of the foil, the firing may be conducted in a low partial pressure of oxygen atmosphere. The dielectric may be re-oxygenated after firing. Re-oxygenating the fired dielectric can be performed at a temperature below the firing temperature.

Preferred dielectrics are comprised of materials with high dielectric constants such as perovskites of the general formula $ABO_3$ in which the A site and B site can be occupied by one or more different metal cation. For example, high K is realized in crystalline barium titanate (BT), lead zirconate titanate (PZT), lead lanthanum zirconate titanate (PLZT), lead magnesium niobate (PMN) and barium strontium titanate (BST). In the method described herein, barium titanate ($BaTiO_3$) based materials are preferred for the dielectric layer because barium titanate based materials have high dielectric constants and are lead free.

Tetravalent metal cations such as zirconium (Zr), hafnium (Hf), tin (Sn) and cerium (Ce) having the preferred oxide stoichiometry of $MO_2$ may partially substitute for titanium in the dielectric material. These metal cations smooth the temperature-dependence of permittivity in the dielectric by "pinching" (shifting) the three phase transitions of $BaTiO_3$ closer to one another in temperature space. Divalent cations having the preferred oxide stoichiometry of MO, where M is an alkaline earth metal (e.g., calcium [Ca], strontium [Sr] and magnesium [Mg]), may partially substitute for barium as these can shift the dielectric temperature maxima to lower temperatures, further smoothing the temperature-dependent response of the dielectric.

Dopant cations may be also be added to the barium titanate to modify the dielectric characteristics. For example, small atomic radii cations of the oxide stoichiometry MO such as calcium (Ca), or magnesium (Mg) as well as transition metal cations such as manganese (Mn), chromium (Cr), cobalt (Co) and iron (Fe) may be used to dope the titanium site with "acceptors" to improve insulation resistance of the dielectric. Small quantities of dopant rare earth cations having the preferred oxide stoichiometry of $R_2O_3$, where R is a rare earth cation (e.g., yttrium [Y], holmium [Ho], dysprosium [Dy], lanthanum [La] and europium [Eu]) may be added to the composition to improve the reliability of the resulting dielectric. The above-described dopants or mixtures of these may be used in various concentrations.

FIG. 1 is a block diagram of a method suitable for forming a dielectric on a metal foil according to the method described herein. In step S110, a metal foil is provided. The metal foil may be of a type generally used in the production of fired-on-foil capacitors. For example, the foil may be a base metal foil such as foil comprised of copper (Cu) or its alloys, copper-invar-copper invar, nickel (Ni), nickel-coated copper, or other metals or metal alloys that have melting points in excess of the firing temperature for thin-film dielectrics. The metallic foil serves as a substrate on which the dielectric is built, and it also serves as a "bottom" electrode in a finished capacitor. Preferred base metal foils include foils comprised predominantly of copper or nickel. The thickness of the foil may be in the range of, for example, between 1 and 100 micrometers, preferably between 3 and 75 micrometers.

If the metallic foil is received from the vendor in clean condition, is carefully handled, and is promptly used, cleaning may not be necessary and the bare untreated metallic foil may be suitable for use in the disclosed method. The metal foil may be cleaned. Cleaning may be accomplished by use of a solvent, such as isopropanol. The foil may also be cleaned by briefly etching the foil, as for example by etching a copper foil for 30 seconds in a dilute solution of copper chloride in hydrochloric acid. The etching solution may be diluted approximately 10,000 times from its concentrated form. The cleaning process removes the excess oxide layer, fingerprints and other accumulated foreign matter from the foil. The surface of the foil may be alternatively cleaned with inductive coupled plasma. Plasma cleaning may be accomplished, for example, using a pressure of about 100 mTorr under a gas mixture of argon and oxygen for 5 minutes, followed by pure argon for 5 minutes. This may also be accomplished in the same unit as used for the deposition of a BST layer, thereby not having to break vacuum.

In step S120, a first dielectric layer of between approximately 0.1-1 micrometers in thickness is deposited over the metal foil. The first dielectric layer may be comprised of any of the above described dielectric materials. In a preferred embodiment, the first dielectric layer comprises barium titanate or barium strontium titanate. The first dielectric layer is designed to be thin and dense. Such thin, dense layers may be accomplished by physical vapor deposition techniques. Physical vapor deposition (PVD) is a thin film deposition process by condensation of a vaporized form of the material being deposited. One such method is radio frequency (RF) sputtering in argon using deposition pressures of around 10 mTorr and RF powers of approximately 200 W. Other physical vapor deposition methods may be used such as laser ablation, pulsed laser deposition, evaporative deposition, high temperature vacuum deposition, electron beam physical vapor deposition, or cathodic deposition.

In step S130, a dielectric precursor solution is deposited over the first dielectric layer. The deposition process of step S130, is preferably a chemical solution deposition (CSD) process such as rod coating, spin coating, dip coating or spray coating. If spin coating is used, a suitable rotation time and speed are 30 seconds at 3000 revolutions per minute. Other conventional coating methods are also practical. The coating process is set up to deposit a dielectric precursor layer of approximately 30-150 nano-meters in thickness.

Figure 2:
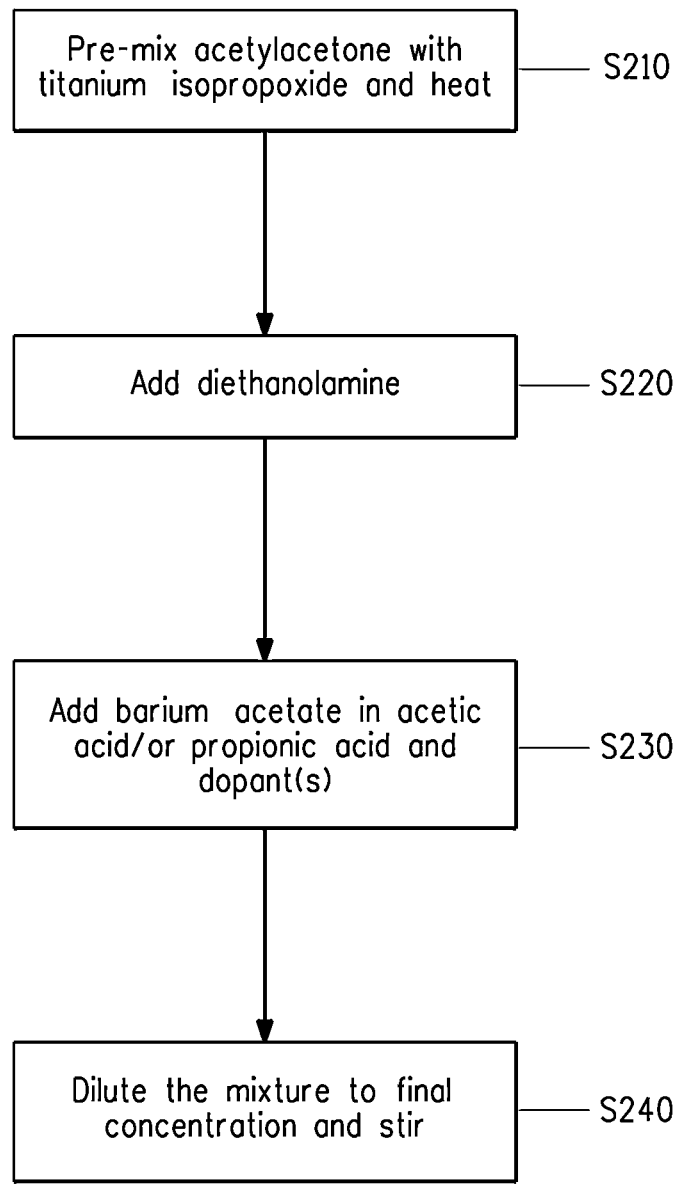
FIG. 2 is a block diagram illustrating a process for preparing a precursor dielectric solution that can be used to form a dielectric precursor layer according to the methods disclosed herein.

The chemical precursor solution from which a $BaTiO_3$ based dielectric precursor solution can be prepared may comprise barium acetate, titanium isopropoxide, acetylacetone, acetic acid, and diethanolamine. Other chemistries are feasible. FIG. 2 is a block diagram illustrating a process for preparing a suitable dielectric precursor solution. In step S210, titanium isopropoxide is premixed with acetylacetone and heated. The premix can be done in, for example, in a PYREX® container, and heating may take place on a hot plate with a surface temperature of about 90° C. In step S220, diethanolamine is added to the titanium isopropoxide/acetylacetone mixture. In step S230, a solution of the barium acetate is prepared in acetic acid or propionic acid and added into the container and stirred. In step S230, if any dopant is to be introduced, the dopant solution (such as manganese acetate tetrahydrate or calcium acetate hydrate, for example) can also be added in the appropriate concentration and the mixed solution is stirred. In step S240, the remainder of the acetic acid or propionic acid is added to the solution to yield a nominal 0.4 mol concentration of the barium titanate precursor. The precursor solution is now suitable for deposition or further dilution with acetic acid, propionic acid or 1-butanol if a more dilute concentration is desired.

Stock solutions of "undoped" or pure barium titanate precursors may be prepared from the following amounts:

| Solution I (for spin-coating use) | |
|---|---|
| Barium acetate | 80 g |
| Titanium isopropoxide | 89.2 g |
| Acetylacetone | 63 g |
| Acetic acid | 680 g |
| Diethanolamine | 9.6 g |
| Solution II (for rod coating use) | |
| Barium acetate | 160 g |
| Titanium isopropoxide | 176 g |
| Acetylacetone | 126 g |
| Propionic acid | 600 g |
| 1-butanol | 200 g |
| Diethanolamine | 8 g |

The precursor solution may or may not contain a dopant source or sources of other substitutions for barium or titanium as previously discussed. For example, an appropriate amount of manganese acetate tetrahydrate or manganese (II) 2-ethylhexanoate may be used to add a desired amount of manganese to the precursor solution. For calcium, calcium nitrate tetrahydrate or calcium 2-ethylhexanoate may be used. For a stable dielectric precursor solution, the above chemicals should be free of water. Water de-stabilizes the precursor composition, resulting in precipitation of titanium oxide. It is therefore important to prepare and deposit the dielectric precursor solution in relatively low humidity environments, such as less than about 40% relative humidity. Once the dielectric precursor solution has been fully deposited on a foil and dried, it is less susceptible to humidity.

Variants of the acetylacetone components and the acetic acid used for dilution in the above-described precursor solution may also be used. For example, acetylacetone may be substituted by an alkoxyalcohol such as 2-methoxyethanol, 2-ethoxyethanol and 1-methoxy-2-propanol. Diethanolamine may be substituted by other ethanolamines such as triethanolamine, and monoethanolamine, or alcohols such as methanol, ethanol, isopropanol, and butanol, for example. Titanium isopropoxide may also be substituted by titanium butoxide.

In step S140 of FIG. 1, the dielectric precursor solution is dried to form a dielectric precursor layer on the first dielectric layer. Drying may be performed, for example, at a temperature of between 100° C. and 300° C. in air for five to fifteen minutes and more typically at a temperature of 150° C. to 250° C. Drying may be accomplished by placing the coated foil on a hot plate. Drying evaporates the solvents in the precursor solution.

In step S150, the dried dielectric precursor layer, the first dielectric layer and the base metal foil are prefired. Prefiring is accomplished at a temperature in the range of 350 to 650° C. The typical ramp rate to the peak temperature is 15-25° C. per minute. Prefiring is preferably repeated after each layer has been dried but prefiring may be undertaken for two or more dried dielectric precursor layers depending upon dried dielectric precursor layer thickness.

Prefiring may be conducted in air or a moist reducing gas atmosphere depending on the underlying metal foil. In the case of a copper foil, its kinetics of oxidation at these temperatures is relatively fast and so a moist reducing gas is preferable. The presence of moisture in the gas atmosphere promotes organic decomposition and removal by hydrolysis. A moist atmosphere may be achieved by bubbling a gas through a water bath prior to entering the prefire furnace. Bubbling a gas through a water bath at 20° C. will create a gas atmosphere with a partial pressure of water vapor of between 0.02-0.03 atmospheres. Higher water bath temperatures will create somewhat higher water vapor levels. A small amount of a reducing gas, such as hydrogen gas, should be present in the prefiring atmosphere. The small amount of the reducing gas insures that the underlying base metal foil is not oxidized during the organic removal. Hydrogen may be safely added to the nitrogen by using forming gas (99% nitrogen and 1% hydrogen mix). Sufficient forming gas is added to maintain the partial pressure of oxygen ($PO_2$) in the prefiring atmosphere to less than about $10^{-8}$ atmospheres. A variety of moist gas mixtures may be used. For example, carbon monoxide may substitute for hydrogen and carbon dioxide or argon may substitute for nitrogen. Small amounts of air may also be included. In case of a nickel foil, the kinetics of oxidation at the prefire temperatures is slow and so prefiring can either be done in a moist atmosphere or, if the temperature is not too high, simply in air.

Prefiring of the dried dielectric precursor layer removes the residual organic material or polymer content of the dried dielectric precursor layer by decomposition and/or hydrolysis or pyrolysis, thus, converting the dried dielectric precursor layer to an amorphous inorganic layer. The prefiring step is conducted under conditions that remove the organic content from the dielectric precursor layer while minimizing the initiating of crystallization of the dielectric precursor material. Crystallization of barium titanate during the prefiring process occurs at maximum initiation sites due to the relatively low prefiring temperature. This creates micro-crystalline grains which will inhibit grain growth in the firing step. If some minor level of crystallization is acceptable, prefiring of a barium titanate based dielectric precursor layers may be performed at a temperature anywhere in the range from approximately 350° C. to a temperature less than about 650° C. If initiation of crystallization is to be avoided, the prefiring of a barium titanate based dielectric precursor layers should be performed at a temperature in the range of approximately 400° C. to less than about 500° C. During prefiring, the period at peak temperature is approximately 10 to 30 minutes.

Prefiring of the deposited dielectric precursor layers improves the green density of each dielectric precursor layer which shrinks the thickness of the dielectric precursor layers. Consecutive dielectric precursor layer deposition, drying and prefiring steps may be used to form the desired final thickness. Removing the organic content of each precursor layer during prefiring allows for shrinkage of the precursor layer, thereby improving its particle packing or "green" density of that layer. Improving the green density at this stage allows for improved densification of the dielectric on firing. This means the level of shrinkage necessary to achieve high densification during firing of the multiple layers will be less than if no prefiring had been practiced.

In step S160, the metal foil, the first dielectric layer and the prefired dielectric precursor is fired to form the dielectric on metal foil. Firing may alternatively be referred to as annealing or sintering. Temperatures for firing the dielectric may range from 700° C. to 1200° C. depending on the melting point of the underlying metal foil and the dielectric micro-structure desired. For example, firing a dielectric on nickel foil may be undertaken at a temperature as high as 1200° C. but for copper foil, firing is limited to about 1050° C. The firing period at peak temperature is typically between 10 and 30 minutes but could be shorter or longer. During the ramp up of temperature during firing, the dielectric crystallizes and further heating promotes grain growth resulting in higher dielectric constants, and densification of the dielectric.

Firing of the dielectric is conducted in a low oxygen partial pressure ($PO_2$) environment to protect the underlying base metal foil from oxidation. The exact atmosphere required will depend upon the temperature and the thermodynamics and kinetics of oxidation of the underlying metal foil. Atmospheres that fully protect the metal foil from oxidation can be thermodynamically derived from standard free energy of formation of oxides as a function of temperature calaculations or diagrams as disclosed in "F. D. Richardson and J. H. E Jeffes, J. Iron Steel Inst., 160, 261 (1948)". For example, using copper as the underlying metallic foil, firing at 700° C., 900° C. and 1050° C. would require partial pressures of oxygen ($PO_2$) of approximately less than $4 \times 10^{-11}$, $3.7 \times 10^{-8}$, and $1.6 \times 10^{-6}$ atmospheres, respectively, to protect the copper from oxidation. For nickel, these values would be less than about $5 \times 10^{-18}$, $5 \times 10^{-13}$, and $1.0 \times 10^{-10}$ atmospheres, respectively for firing at 700° C., 900° C. and 1050° C. When firing the dielectric, it is desirable to have the highest $PO_2$ level feasible in order to minimize oxygen vacancy and free electron formation due to reduction of the dielectric. The $PO_2$ level should be set at the highest level possible that will not cause significant oxidation of the metallic foil. A small amount of oxidation of the metal foil may be acceptable and, therefore, the $PO_2$ level for the atmosphere during firing of the dielectric may be higher than that calculated to entirely protect the foil from oxidation. However, if the level of oxidation is too high, a thick oxide layer will be formed on the underlying metal foil which reduces the effective dielectric constant of the dielectric. The optimum oxygen partial pressure depends on the metal foil, dopant type and concentration if used, and the firing temperature. For example, when the foil is copper, the rate of oxidation is relatively fast and the oxide thickness grows in a linear fashion with time and temperature so the $PO_2$ level is generally set at that required to maintain a non-oxidized surface, i.e., to a lower $PO_2$ level than $10^{-6}$ atmospheres when firing at 1050° C., for example. In the case of nickel, the oxidation kinetics are sufficiently slow that a more oxidizing atmosphere may be used than that predicted by free energy calculations. For example, firing at 900° C. under a $PO_2$ level of $10^{-12}$ atmospheres is feasible.

The desired oxygen partial pressure in the furnace may be achieved by use of suitable gas combinations or vacuum. Such combinations include pure nitrogen, nitrogen/forming gas/water mixtures, nitrogen/forming gas mixtures, nitrogen/forming gas, carbon dioxide mixtures, carbon dioxide/carbon monoxide mixtures, etc. A typical forming gas is a mixture of 99% nitrogen and 1% hydrogen gas. After firing the foil and dielectric are allowed to cool.

In step S170 shown in FIG. 1, the dielectric may be re-oxygenated. The high firing temperature and the low oxygen reducing atmosphere present during firing may result in a dielectric with reduced oxygen in the lattice of the dielectric. This tends to result in a high concentration of oxygen vacancies, which leads to high leakage and poor long-term reliability when the dielectric is used in a capacitor. However, re-oxidation can put oxygen back into the lattice and generally occurs at a lower temperature and at higher oxygen contents than used during the firing process. Whether a re-oxidation process is used depends on firing conditions used. Typically, re-oxidation is conducted for about 30 minutes at a temperature of between 400° C. and 700° C. in an atmosphere that has a partial pressure of oxygen in the range of ambient air to $10^{-6}$ atmospheres. For a dielectric on copper foil, reoxidation will require an atmosphere that avoids oxidation of the foil. The exact atmosphere required depends on the temperature and may range from $10^{-2}$ to $10^{-6}$ atmospheres. For a dielectric on nickel foil, a re-oxidation in air at 400-600° C. for 10 to 30 minutes or more may be used without severe oxidation of the foil due to the slow kinetics of oxidation of nickel at these temperatures. Reoxidation may be incorporated into the cool down zone of the furnace after firing by converting the nitrogen/forming gas mixture to a more oxidizing atmosphere. For example, the forming gas may be switched off at 600° C. allowing just nitrogen to flow through the furnace. A nitrogen atmosphere will result in a partial pressure of oxygen of approximately $10^{-6}$ atmospheres due to its impurity oxygen content. If the firing of the dielectric is undertaken under less severe reducing conditions, such as under pure nitrogen and/or if the dielectric is doped with acceptor dopants, re-oxidation may be eliminated. With acceptor doping, conduction electrons are trapped by the acceptor dopant so that a decrease in insulation resistance and an increase in dielectric losses are suppressed. After firing, the thickness of the first dielectric layer deposited by PVD is typically in the range of 0.1 to 1 micrometers, and the thickness of the complete dielectric (PVD and CSD deposited layers) is typically in the range of 0.5 to 2.5 micrometers, and is more preferably in the range of 0.5 to 1.5 micrometers.

In step S180, top electrodes are formed over the resulting dielectric. The top electrode can be formed by, for example, sputtering, evaporation, chemical vapor deposition, electroless plating, printing or other suitable deposition methods. In one embodiment, a sputtered copper electrode is used. Other suitable materials for the top electrode include nickel, platinum, gold and palladium. The top electrode(s) may be plated with copper to increase thickness, if desired.

The disclosed process for making a dielectric provides a fired-on-foil dielectric with desirable physical and electrical properties. One desirable physical property is a dense microstructure. Another desirable property is the low defect rate which makes it possible to make large area capacitors, for example 20 mm by 20 mm capacitors, with high yield. The area of the capacitor made according to the disclosed method may be greater than 80 $mm^2$, and may be greater than 400 $mm^2$, and may even be greater than 2500 $mm^2$. Another desirable physical property is the resultant dielectric grain sizes that are typically between 0.05 and 0.2 micrometers. One desirable electrical property resulting from the grain size is that capacitors formed from such dielectrics have capacitance densities in excess of 0.5 microFarad per centimeter squared ($\mu F/cm^2$). Another desirable electrical property of capacitors formed from such dielectrics is an insulation resistance in excess of $1 \times 10^6$ Ohm-square centimeter ($\Omega \cdot cm^2$).

Variants on the above process may be practiced. For example, the first dielectric layer may be fired prior to deposition of the dielectric precursor layer. Also, prefiring may be undertaken after two or more dielectric precursors have been deposited, the number of layers dependent upon each layer thickness.

The following examples illustrate the favorable properties that can be obtained in dielectrics prepared according to the disclosed method, and the capacitors prepared accordingly.

EXAMPLES

Stock solutions I and II were prepared in the manner described in FIG. 2. A manganese dopant solution for stock solution I was prepared by dissolving manganease acetate tetrahydrate (2.13 g) in acetic acid (32.87 g) and water (7.03 g). A manganese dopant solution for stock solution II was prepared by dissolving manganese 2-ethylhexanoate (7 g) in propionic acid (32.35 g). A calcium dopant solution for stock solution I was made by dissolving calcium nitrate tetrahydrate (2 g) in acetic acid (34 g). A calcium dopant solution for stock solution II was prepared by dissolving calcium 2-ethylhexanoate (6 g) in propionic acid (29.7 g). The formulas used for this work were diluted with appropriate amounts of acetic acid or propionic acid/butanol/diethanolamine. The stock solutions were doped using the appropriate dopant solutions.

Example 1

A barium strontium titanate (BST) first dielectric layer was sputtered on to the surface of nickel foil to a nominal thickness of 0.25 micrometer. The sputtering target was doped barium strontium titanate with a composition of $Ba_{0.25}Sr_{0.25}Ti_{0.493528}Mn_{0.0679}Nb_{0.4}Mg_{0.1793}O_3$. The deposition was accomplished by radio frequency (RF) sputtering in argon using a deposition pressure of around 10 mTorr using an RF power of 200 W. A nominal 0.4 mol (M) barium titanate dielectric precursor solution doped with a nominal 0.4 mole % manganese was spin-coated onto the sputtered BST first dielectric layer. The coating speed was 3000 rpm. The dielectric precursor solution was then dried in air for 7 minutes at 250° C. The dried dielectric precursor layer was then prefired for 10 minutes at 450° C. in a moist nitrogen/forming gas mixture that was created by bubbling a mixture of nitrogen and forming gas (99% nitrogen and 1% hydrogen) through a water bath at approximately 20° C. to create a gas atmosphere with a partial pressure of water vapor of about between 0.02 and 0.03 atmospheres. The hydrogen content in the nitrogen was adjusted to give between 0.015% to 0.02% hydrogen in nitrogen. Measurement of the partial pressure of oxygen at the temperatures used for the prefire process was not accurate, but the moist gas mixture was estimated to give a partial pressure of oxygen of approximately $10^{-12}$ atmospheres. The same process of spin coating deposition, drying and prefiring at 450° C. was repeated 10 times.

The multiple dried and prefired dielectric precursor layers, the sputtered BST first dielectric layer and the nickel foil were fired in a 6 inch internal diameter tube furnace at 900° C. for 20 minutes at peak temperature. Firing was undertaken under a dry atmosphere consisting of a mixture of nitrogen and forming gas (99% nitrogen 1% hydrogen). The flow rates of the nitrogen and forming gas into the furnace were adjusted to give approximately 10 liters per minutes of nitrogen and 15-20 cubic centimeters (cc) per minute of forming gas to give between 0.015% to 0.02% hydrogen in nitrogen. The partial pressure of oxygen at the firing temperature was approximately $10^{-14}$ atmospheres as measured by use of a zirconia cell placed inside the furnace. The ramp rate of the furnace during the heating phase was approximately 15° C. per minute. During the cooling process, the forming gas supply to the furnace was switched off at 600° C. so that the dielectric was exposed to pure nitrogen at a partial pressure of oxygen of approximately $10^{-6}$ atmospheres to reoxidize the dielectric without oxidizing the underlying nickel foil.

After removal from the furnace, copper electrodes varying in size from 1 mm by 1 mm to 10 mm by 10 mm were formed on the dielectric by sputtering copper through a mask. All capacitor sizes had a 100% yield. Three 10 mm by 10 mm capacitors were measured for capacitance density, dissipation factor and insulation resistance. The capacitors exhibited capacitance densities of between approximately 0.6 to 0.8 $\mu F/cm^2$ when measured at 0 volt. The dissipation factors were less than 10% and insulation resistance when measured at 2 volts for 2 minutes was between approximately $1\times10^8$ $\Omega \cdot cm^2$ and $6\times10^8$ $\Omega \cdot cm^2$.

Figure 3:
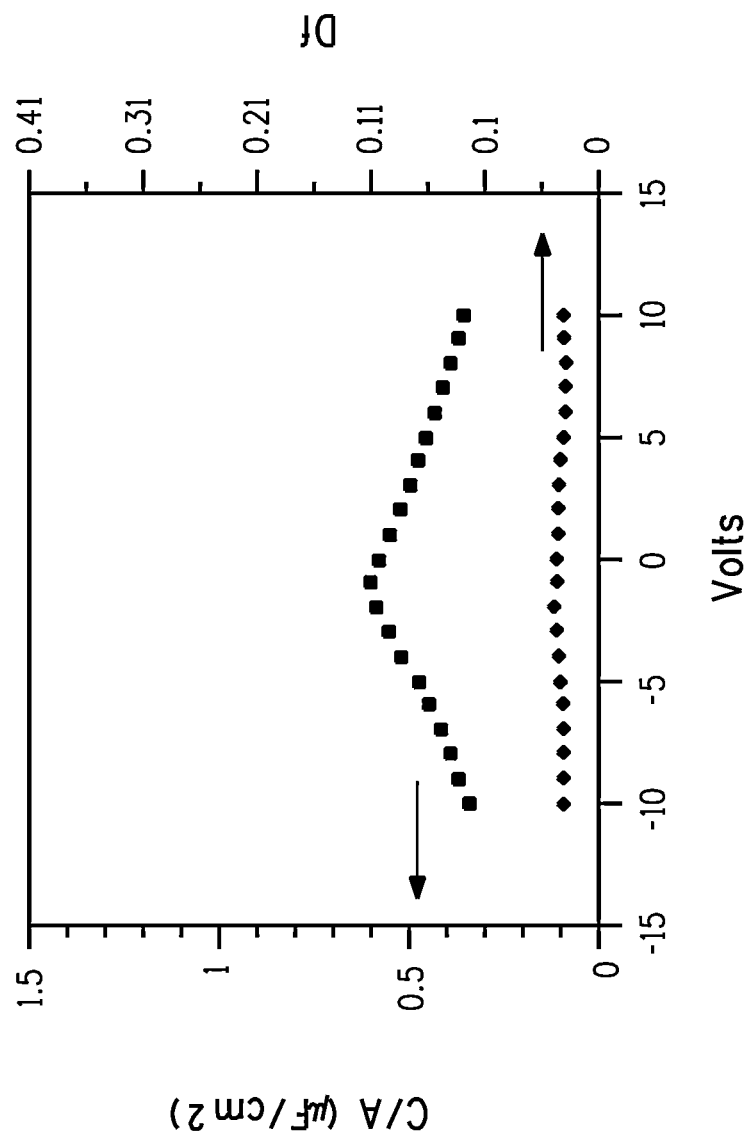
FIG. 3 is a graph showing capacitance density and dissipation factor of a 10 mm by 10 mm (100 $mm^2$) capacitor as a function of voltage of a representative sample of barium titanate on nickel foil that was prepared as described in Example 1.
Figure 4:
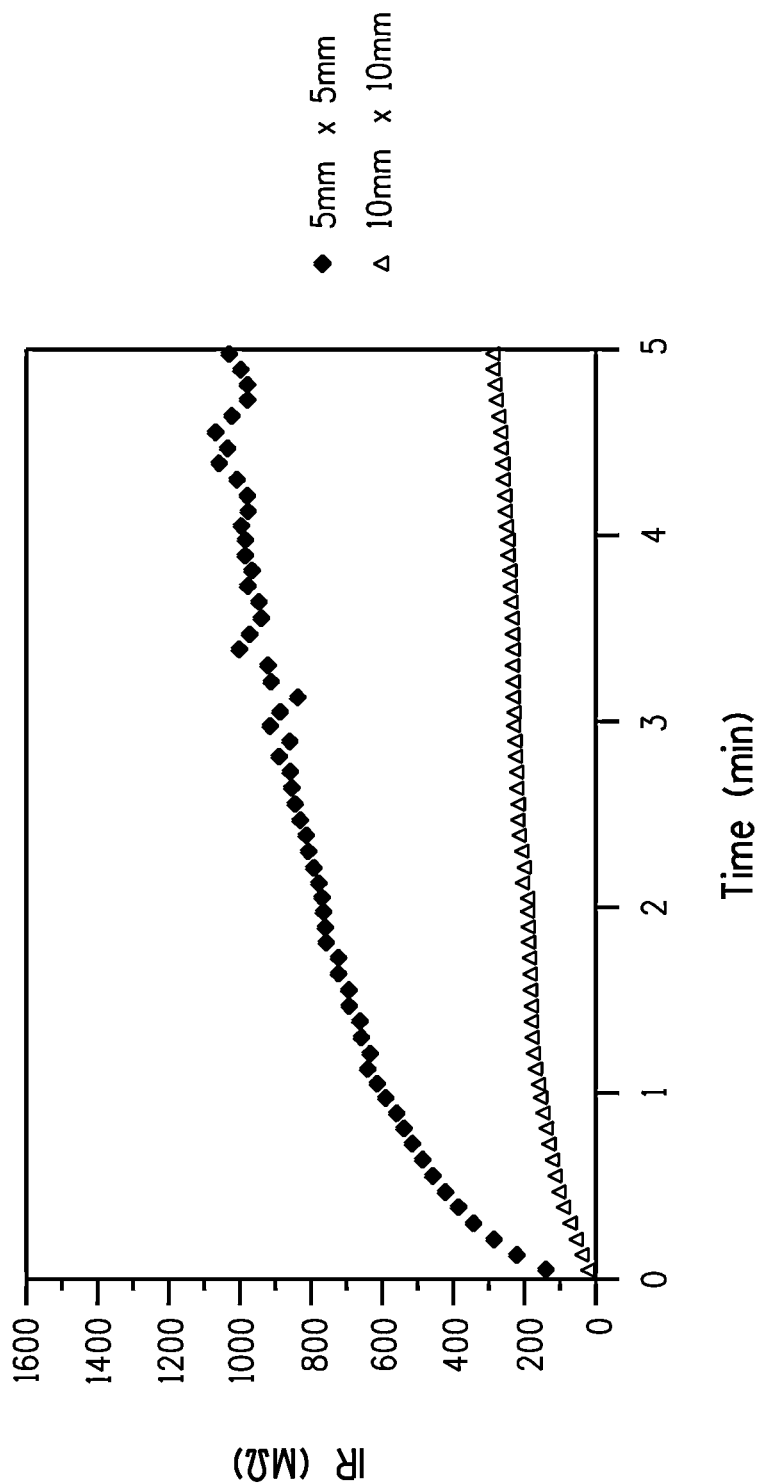
FIG. 4 is a plot showing the insulation resistance of 5 mm by 5 mm (25 $mm^2$) and 10 mm by 10 mm (100 $mm^2$) capacitors on nickel foil that were prepared as described in Example 1.
Figure 5:
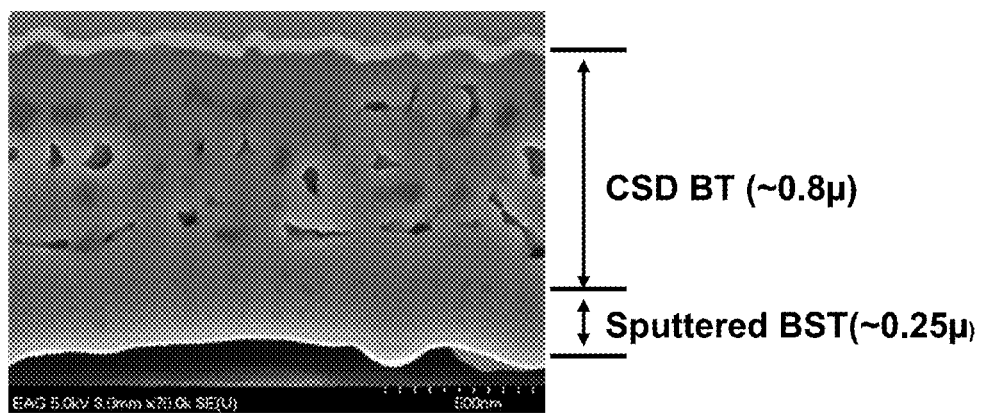
FIG. 5 is a FIB image showing a cross-section of a dielectric that was prepared as described in Example 1.

FIG. 3 shows capacitance density and dissipation factor as a function of voltage. The capacitors show good properties out to at least 10 volts. FIG. 4 shows that the insulation resistance of representative samples of 5 mm×5 mm and 10 mm×10 mm electrodes measured at 2 volts as a function of time. FIG. 5 shows the cross-sectional focused ion beam (FIB) images of the dielectric. As can be seen, total dielectric thickness is approximately 1.05 micrometers and the sputtered barium strontium titanate (PVD BST) first dielectric layer is thin and dense. The overlying barium titanate derived from the CSD precursor is not as dense although all porosity is enclosed. The thin dense barium strontium titanate first dielectric layer allows for the enhanced dielectric properties.

Example 2

A barium strontium titanate first dielectric layer was sputtered on to the surface of nickel foil to a nominal thickness of 0.4 micrometers. The target composition and deposition conditions were as described in Example 1. A nominal 0.3 M barium titanate dielectric precursor solution doped with a nominal 0.4 mole % manganese was spin coated onto the sputtered BST first dielectric layer. The coating speed was 3000 rpm. The precursor solution was then dried in air for 7 minutes at 250° C. The dried precursor was then prefired for 20 minutes at 450° C. in air. The ramp rate of the furnace during the prefire heating phase was approximately 15° C. per minute. The same process of spin coating deposition, drying and prefiring at 450° C. in air was repeated 15 times to obtain the desired film thickness.

The multiple dried and prefired dielectric precursor layers, the sputtered BST first dielectric layer and the nickel foil were fired in a six inch internal diameter tube furnace at 900° C. for 20 minutes at peak temperature. Firing was undertaken under the same ramp rate and furnace atmosphere conditions as described in Example 1. The partial pressure of oxygen at the firing temperature was approximately $10^{-15}$ atmospheres as measured by use of a zirconia cell placed inside the furnace. During the cooling process, the forming gas supply to the furnace was switched off at 600° C. so that the dielectric was exposed to pure nitrogen at a partial pressure of oxygen of approximately $10^{-6}$ atmospheres to reoxidize the dielectric without oxidizing the underlying nickel foil.

After removal from the furnace, copper electrodes varying in size from 1 mm by 1 mm to 10 mm by 10 mm were formed on the dielectric by sputtering copper through a mask. The 10 mm by 10 mm capacitors were measured for capacitance density, dissipation factor and insulation resistance. The capacitors exhibited capacitance densities of approximately 0.8 $\mu F/cm^2$ when measured at 0 volt. The dissipation factors were less than 10% and insulation resistance when measured at 2 volts for 2 minutes was approximately $3\times10^7$ $\Omega \cdot cm^2$.

Figure 6:
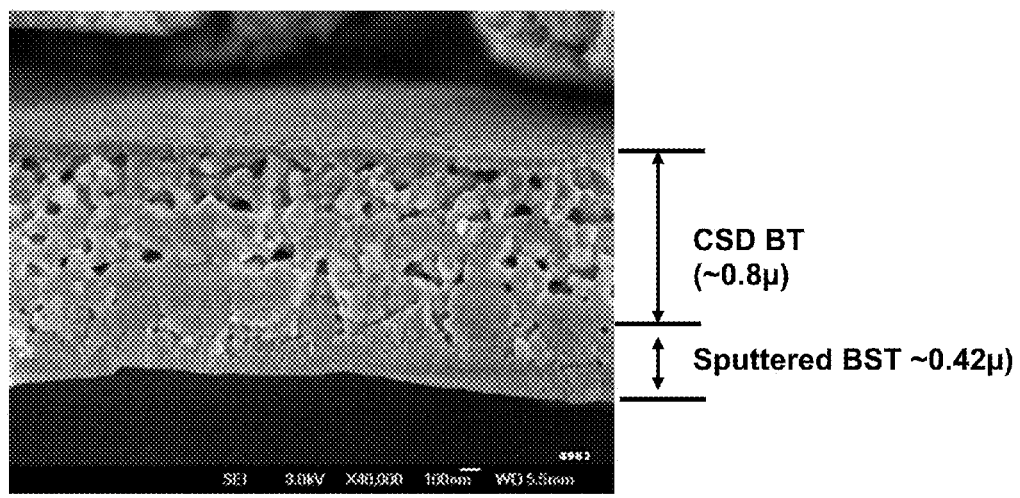
FIG. 6 is a cross-sectional SEM image showing a dielectric that was prepared as described in Example 2.

FIG. 6 shows a cross-sectional scanning electron microscope (SEM) image of an Example 2 fractured sample. As can be seen, the barium strontium titanate sputtered layer (PVD BST) is very dense. The thickness of the BST layer is approximately 0.42 micrometers and the total dielectric thickness is approximately 1.22 micrometers.

Example 3

A barium strontium titanate first dielectric layer was sputtered on to the surface of nickel foil to a nominal thickness of 0.4 micrometers. The target composition and deposition conditions were as described in Example 1. The sputtered BST first dielectric layer and the Ni foil was then fired in a six inch internal diameter tube furnace at 900° C. for 20 minutes at peak temperature using the same ramp rate and furnace atmosphere conditions as described in Example 1. The partial pressure of oxygen at the firing temperature was approximately $10^{-15}$ atmospheres as measured by use of a zirconia cell placed inside the furnace. During the cooling process, the forming gas supply to the furnace was switched off at 600° C. so that the dielectric was exposed to pure nitrogen at a partial pressure of oxygen of approximately $10^{-6}$ atmospheres to reoxidize the dielectric without oxidizing the underlying nickel foil.

A nominal 0.3 M barium titanate dielectric precursor solution doped with a nominal 0.4 mole % manganese was spin coated onto the fired sputtered BST layer. The coating speed was 3000 rpm. The precursor solution was then dried in air for 7 minutes at 250° C. The dried precursor was then prefired for 20 minutes at 450° C. in air. The ramp rate of the furnace during the prefire heating phase was approximately 15° C. per minute. The same process of spin coating deposition, drying and prefiring at 450° C. was repeated 15 times in order to obtain the desired film thickness.

The multiple dried and prefired dielectric precursor layers, the fired BST layer and the nickel foil were fired under the same conditions that was used for firing of the sputtered BST layer.

After removal from the furnace, copper electrodes varying in size from 1 mm by 1 mm to 10 mm by 10 mm were formed on the dielectric by sputtering copper through a mask. The 10 mm by 10 mm capacitors were measured for capacitance density, dissipation factor and insulation resistance. The capacitors exhibited capacitance densities of approximately 0.8 µF/cm$^2$ when measured at 0 volt. The dissipation factors were less than 9% and insulation resistance when measured at 2 volts for 2 minutes was between approximately $3\times10^7$ $\Omega\cdot cm^2$ and $8\times10^7$ $\Omega\cdot cm^2$.

Example 4

A barium strontium titanate first dielectric layer was sputtered on to the surface of nickel foil to a nominal thickness of 0.25 micrometers. The target composition and deposition conditions were as described in Example 1. The sputtered BST first dielectric layer and the Ni foil was then fired in a six inch internal diameter tube furnace at 900° C. for 20 minutes at peak temperature using the same ramp rate and furnace atmosphere conditions as described in Example 1. The partial pressure of oxygen at the firing temperature was approximately $10^{-15}$ atmospheres as measured by use of a zirconia cell placed inside the furnace. During the cooling process, the forming gas supply to the furnace was switched off at 600° C. so that the dielectric was exposed to pure nitrogen at a partial pressure of oxygen of approximately $10^{-6}$ atmospheres to reoxidize the dielectric without oxidizing the underlying nickel foil.

A nominal 0.3 M barium titanate dielectric precursor solution doped with a nominal 0.4 mole % manganese was spin coated onto the fired sputtered BST first dielectric layer. The coating speed was 3000 rpm. The precursor solution was then dried in air for 7 minutes at 250° C. The dried precursor was then prefired for 20 minutes at 450° C. in an air. The ramp rate of the furnace during the prefire heating phase was approximately 15° C. per minute. The same process of spin coating deposition, drying and prefiring at 450° C. was repeated 15 times in order to obtain the desired film thickness.

The multiple dried and prefired dielectric precursor layers on the nickel foil were fired in the same condition that was used for firing the sputtered BST first dielectric layer.

After removal from the furnace, copper electrodes varying in size from 1 mm by 1 mm to 10 mm by 10 mm were formed on the dielectric by sputtering copper through a mask. The 10 mm by 10 mm capacitors were measured for capacitance density, dissipation factor and insulation resistance. The capacitors exhibited capacitance densities of approximately 1.2 µF/cm$^2$ when measured at 0 volt. The dissipation factors were approximately 10% and insulation resistance when measured at 2 volts for 2 minutes was between approximately $4\times10^6$ $\Omega\cdot cm^2$ and $5\times10^7$ $\Omega\cdot cm^2$.

Figure 7:
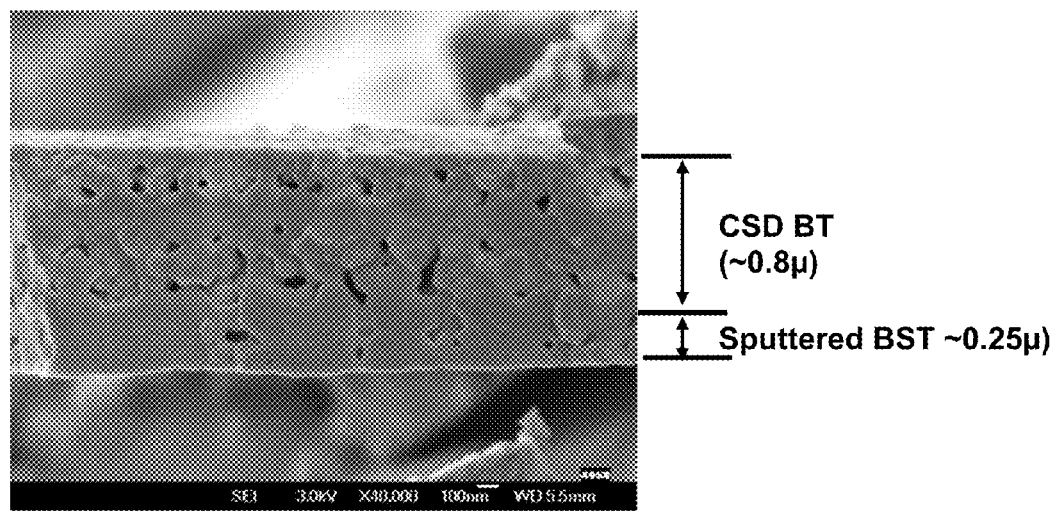
FIG. 7 is a cross-sectional SEM image of a dielectric that was prepared as described in Example 4.

FIG. 7 shows a cross-sectional SEM image of a sample from Example 4 that has been fractured. As can be seen, the sputtered barium strontium titanate layer (PVD BST) is very dense. The thickness of the BST sputtered layer is approximately 0.25 micrometers and the total dielectric thickness is approximately 1.05 micrometers.

Example 5

A barium strontium titanate first dielectric layer was sputtered on to the surface of nickel foil to a nominal thickness of 0.1 micrometers. The target composition and deposition conditions were as described in Example 1.

A nominal 0.3 M barium titanate dielectric precursor solution doped with a nominal 0.4 mole % manganese was spin coated onto the sputtered BST first dielectric layer. The coating speed was 3000 rpm. The precursor solution was then dried in air for 7 minutes at 250° C. The dried precursor was then prefired for 20 minutes at 450° C. in air. The ramp rate of the furnace during the prefire heating phase was approximately 15° C. per minute. The same process of spin coating deposition, drying and prefiring at 450° C. was repeated 20 times in order to obtain the desired film thickness.

The multiple dried and prefired dielectric precursor layers, the BST first dielectric layer and the nickel foil were fired in a six inch internal diameter tube furnace at 900° C. for 20 minutes at peak temperature using the same ramp rate and furnace atmosphere conditions as described in Example 1. The partial pressure of oxygen at the firing temperature was approximately $10^{-15}$ atmospheres as measured by use of a zirconia cell placed inside the furnace. During the cooling process, the forming gas supply to the furnace was switched off at 600° C. so that the dielectric was exposed to pure nitrogen at a partial pressure of oxygen of approximately $10^{-6}$ atmospheres to reoxidize the dielectric without oxidizing the underlying nickel foil.

After removal from the furnace, copper electrodes varying in size from 1 mm by 1 mm to 10 mm by 10 mm were formed on the dielectric by sputtering copper through a mask. The 5 mm×5 mm and 10 mm by 10 mm capacitors were measured for capacitance density, dissipation factor and insulation resistance. The capacitors exhibited capacitance densities of approximately 1.3 µF/cm$^2$ when measured at 0 volt. The dissipation factors were between approximately 13 and 17% and insulation resistance when measured at 2 volts for 2 minutes was between approximately $5\times10^6$ $\Omega\cdot Q$ cm$^2$ and $2\times10^7$ $\Omega\cdot cm^2$.

Figure 8:
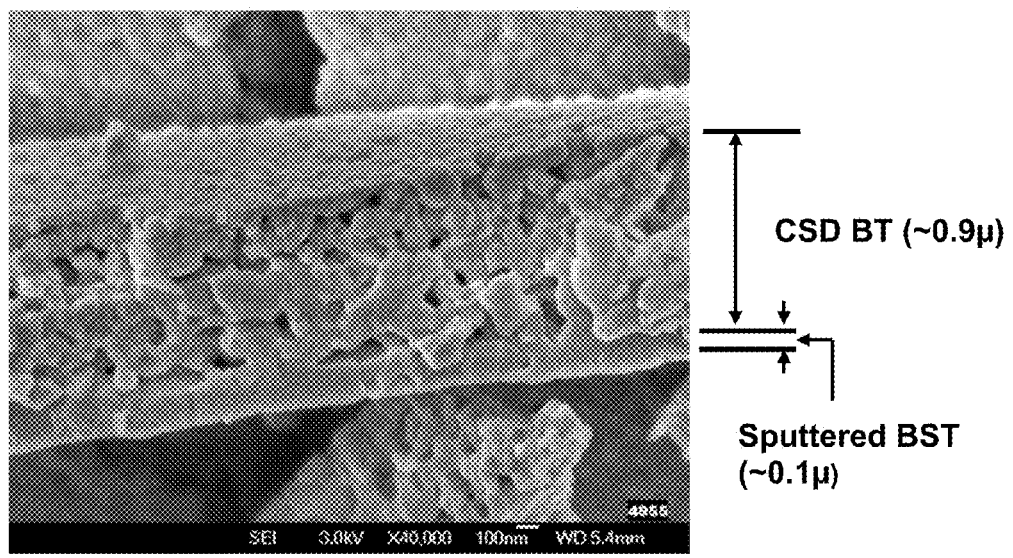
FIG. 8 is a cross-sectional SEM image showing a dielectric prepared as described in Example 5.

FIG. 8 shows a cross-sectional SEM image of a sample from Example 5 that has been fractured. As can be seen, the sputtered barium strontium titanate layer (PVD BST) is very dense. The thickness of the BST layer is approximately 0.1 micrometers and the total dielectric thickness is approximately 1.0 micrometers.

Example 6

A barium strontium titanate first dielectric layer was sputtered on to the surface of nickel foil to a nominal thickness of 0.1 micrometers. The target composition and deposition conditions were as described in Example 1.

A nominal 0.25 M barium titanate dielectric precursor solution doped with a nominal 0.1 mole % calcium was spin coated onto the sputtered BST first dielectric layer. The precursor solution was then dried in air for 7 minutes at 250° C. The dried precursor was then prefired for 20 minutes at 450° C. in air. The ramp rate of the furnace during the prefire heating phase was approximately 15° C. per minute. The same process of spin coating deposition, drying and prefiring at 450° C. was repeated 17 times in order to obtain the desired film thickness.

The multiple dried and prefired dielectric precursor layers, the sputtered BST first dielectric layer and the nickel foil were fired in a six inch internal diameter tube furnace at 900° C. for 20 minutes at peak temperature using the same ramp rate and furnace atmosphere conditions as described in Example 1. The partial pressure of oxygen at the firing temperature was approximately $10^{-15}$ atmospheres as measured by use of a zirconia cell placed inside the furnace. During the cooling process, the forming gas supply to the furnace was switched off at 600° C. so that the dielectric was exposed to pure nitrogen at a partial pressure of oxygen of approximately $10^{-6}$ atmospheres to reoxidize the dielectric without oxidizing the underlying nickel foil.

After removal from the furnace, a copper electrode of 20 mm×20 mm in size was formed on the dielectric by sputtering copper through a mask. The 20 mm by 20 mm capacitor was measured for capacitance density, dissipation factor and insulation resistance. The capacitor exhibited a capacitance density of approximately 1.3 µF/cm² when measured at 0 volt. The dissipation factor was 11% and insulation resistance when measured at 2 volts for 2 minutes was approximately $8 \times 10^6$ Ω·cm².

Example 7

A barium strontium titanate first dielectric layer was sputtered on to the surface of a 5 inch by 5 inch, 25 micrometers thick, nickel foil. The target composition and deposition conditions were as described in Example 1. A nominal 0.2 M barium titanate dielectric precursor solution doped with a nominal 0.2 mole % manganese was rod coated on to the sputtered BST first dielectric layer. The precursor solution was then dried in air for 7 minutes at 100° C. followed by 7 minutes at 250° C. The dried dielectric precursor was then prefired at 450° C. for 20 minutes in air. The ramp rate of the furnace during the prefire heating phase was approximately 15° C. per minute. The same process of rod coating deposition, drying and prefiring at 450° C. was repeated 15 times in order to obtain the desired film thickness.

The multiple dried and prefired dielectric precursor layers, the first dielectric layer and the nickel foil were fired in a six inch internal diameter tube furnace at 900° C. for 20 minutes at peak temperature using the same ramp rate and furnace atmosphere conditions as described in Example 1. The partial pressure of oxygen at the firing temperature was approximately $10^{-15}$ atmospheres as measured by use of a zirconia cell placed inside the furnace. During the cooling process, the forming gas supply to the furnace was switched off at 600° C. so that the dielectric was exposed to pure nitrogen at a partial pressure of oxygen of approximately $10^{-6}$ atmospheres to reoxidize the dielectric without oxidizing the underlying nickel foil.

After removal from the furnace, copper electrodes of 10 mm×10 mm and 20 mm×20 mm in size were formed on the dielectric by sputtering copper through a mask. The capacitance density was 1.0 µF/cm² when measured at 0 volt. The dissipation factors were less than 7% and the insulation resistance when measured at 2 volts for 2 minutes was between about $3 \times 10^6$ and $2 \times 10^8$ Ω·cm².

Figure 9:
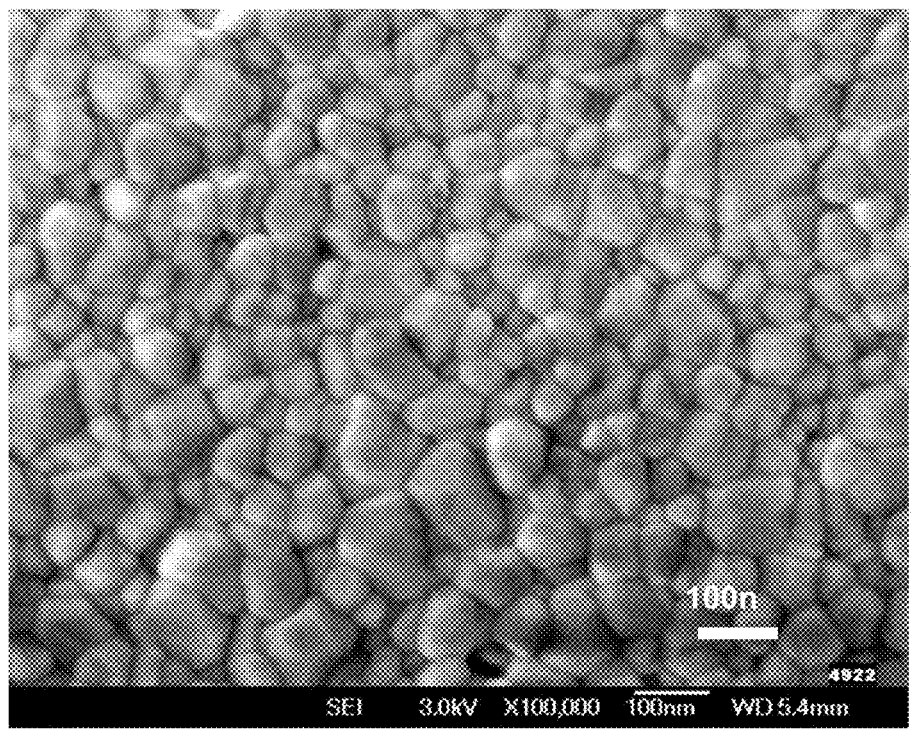
FIG. 9 is a top surface SEM image of the dielectric that was prepared as described in Example 7.
Figure 10:
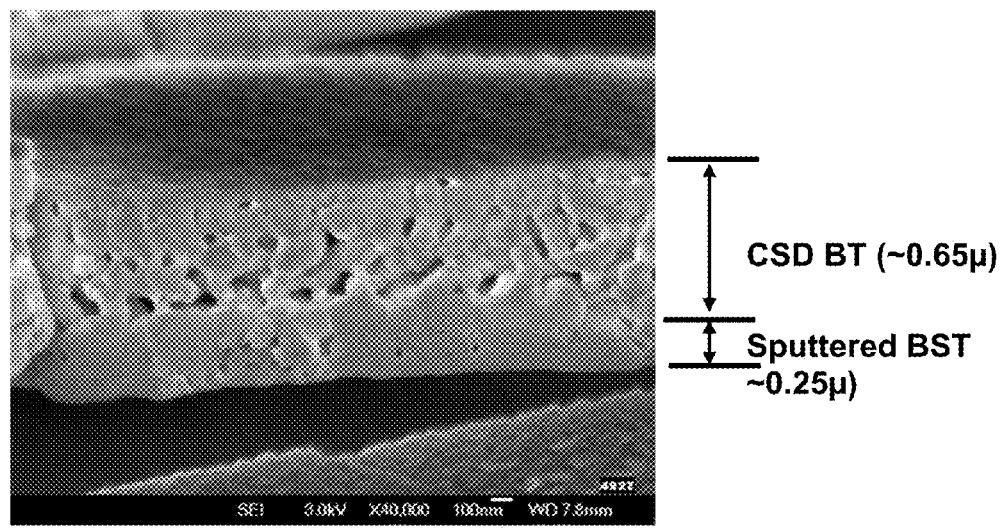
FIG. 10 is a cross-sectional SEM image showing the dielectric prepared as described in Example 7.

FIG. 9 shows a top SEM images for the rod-coated CSD barium titanate. It shows a grain size in the order of 100 nanometers. FIG. 10 shows a cross-sectional SEM image of a fractured sample. As can be seen, the sputtered barium strontium titanate layer (PVD BST) is dense. Total thickness of the dielectric layer is approximately 0.9 micrometers, of which the BST layer is approximately 0.25 micrometers.

Example 8

A barium strontium titanate first dielectric layer was sputtered on to the surface of a 5 inch by 5 inch, 25 micrometers thick, nickel foil. The target composition and deposition conditions were as described in Example 1. The BST first dielectric layer and the nickel foil were then fired in a six inch internal diameter tube furnace at 900° C. for 20 minutes at peak temperature using the same ramp rate and furnace atmosphere conditions as described in Example 1. The partial pressure of oxygen at the firing temperature was approximately $10^{-15}$ atmospheres as measured by use of a zirconia cell placed inside the furnace. During the cooling process, the forming gas supply to the furnace was switched off at 600° C. so that the dielectric was exposed to pure nitrogen at a partial pressure of oxygen of approximately $10^{-6}$ atmospheres to reoxidize the dielectric without oxidizing the underlying nickel foil.

A nominal 0.2 M barium titanate dielectric precursor solution doped with a nominal 0.2 mole % manganese was rod coated on to the sputtered and fired BST first dielectric layer. The precursor solution was then dried in air for 7 minutes at 100° C. followed by 7 minutes at 250° C. The dried dielectric precursor was then prefired at 450° C. for 20 minutes in air. The ramp rate of the furnace during the prefire heating phase was approximately 15° C. per minute. The same process of rod coating deposition, drying and prefiring at 450° C. was repeated 15 times in order to obtain the desired film thickness.

The multiple dried and prefired dielectric precursor layers, the fired sputtered BST layer and the nickel foil were fired in a six inch internal diameter tube furnace at 900° C. for 20 minutes at peak temperature using the same conditions as for the firing of the sputtered layer. The partial pressure of oxygen at the firing temperature was approximately $10^{-15}$ atmospheres as measured by use of a zirconia cell placed inside the furnace. During the cooling process, the forming gas supply to the furnace was switched off at 600° C. so that the dielectric was exposed to pure nitrogen at a partial pressure of oxygen of approximately $10^{-6}$ atmospheres to reoxidize the dielectric without oxidizing the underlying nickel foil.

After removal from the furnace, copper electrodes of 20 mm×20 mm in size were formed on the dielectric by sputtering copper through a mask. The capacitance density was between 1.0 µF/cm² and 1.3 µF/cm² when measured at 0 volt. The dissipation factors were less than 9% and the insulation resistances when measured at 2 volts for 2 minutes were between approximately $1 \times 10^7$ Ω·cm² and $9 \times 10^7$ Ω·cm².

Example 9

A barium strontium titanate first dielectric layer was sputtered on to the surface of a 5 inch by 5 inch, 25 micrometers thick, nickel foil. The target composition and deposition conditions were as described in Example 1. A nominal 0.2 M barium titanate dielectric precursor solution doped with a nominal 0.1 mole % calcium was rod coated on to the BST first dielectric layer. The precursor solution was then dried in air for 7 minutes at 100° C. followed by 7 minutes at 250° C. The dried dielectric precursor was then prefired at 450° C. for 20 minutes in air. The ramp rate of the furnace during the prefire heating phase was approximately 15° C. per minute. The same process of rod coating deposition, drying and pre-firing at 450° C. was repeated 15 times in order to obtain the desired film thickness.

The multiple dried and prefired dielectric precursor layers, the sputtered BST first dielectric layer and the nickel foil were fired in a six inch internal diameter tube furnace at 900° C. for 20 minutes at peak temperature using the same ramp rate and furnace atmosphere conditions as described in Example 1. The partial pressure of oxygen at the firing temperature was approximately $10^{-15}$ atmospheres as measured by use of a zirconia cell placed inside the furnace. During the cooling process, the forming gas supply to the furnace was switched off at 600° C. so that the dielectric was exposed to pure nitrogen at a partial pressure of oxygen of approximately $10^{-6}$ atmospheres to reoxidize the dielectric without oxidizing the underlying nickel foil.

After removal from the furnace, copper electrodes of 20 mm×20 mm in size were formed on the dielectric by sputtering copper through a mask. The capacitance densities were between 1.2 μF/cm$^2$ and 1.3 μF/cm$^2$ when measured at 0 volt. The dissipation factors were less than 6% and the insulation resistances when measured at 2 volts for 2 minutes were between 2×10$^6$ Ω·cm$^2$ and 2×10$^7$ Ω·cm$^2$.

Comparative Example A

A nominal 0.4 mol (M) barium titanate dielectric precursor solution doped with a nominal 0.4 mole % manganese was spin-coated onto Ni a 5 inch by 5 inch, 25 micrometers thick, nickel foil. The coating speed was 3000 rpm. The dielectric precursor solution was then dried in air for 7 minutes at 250° C. The dried dielectric precursor layer was then prefired for 10 minutes at 450° C. in a moist nitrogen/forming gas mixture that was created by bubbling a mixture of nitrogen and forming gas (99% nitrogen and 1% hydrogen) through a water bath at approximately 20° C. to create a gas atmosphere with a partial pressure of water vapor of about between 0.02 and 0.03 atmospheres. The hydrogen content in the nitrogen was adjusted to give between 0.015% to 0.02% hydrogen in nitrogen. Measurement of the partial pressure of oxygen at the temperatures used for the prefire process was not accurate, but the moist gas mixture was estimated to give a partial pressure of oxygen of approximately $10^{-12}$ atmospheres. The same process of spin coating deposition, drying and prefiring at 450° C. was repeated 10 times in order to obtain the desired film thickness.

The multiple dried and prefired dielectric precursor layers and the nickel foil were fired in a 6 inch internal diameter tube furnace at 900° C. for 20 minutes at peak temperature. Firing was undertaken under a dry atmosphere consisting of a mixture of nitrogen and forming gas (99% nitrogen 1% hydrogen). The flow rates of the nitrogen and forming gas into the furnace were adjusted to give approximately 10 liters per minutes of nitrogen and 15-20 cubic centimeters (cc) per minute of forming gas to give between 0.015% to 0.02% hydrogen in nitrogen. The partial pressure of oxygen at the firing temperature was approximately $10^{-14}$ atmospheres as measured by use of a zirconia cell placed inside the furnace. The ramp rate of the furnace during the heating phase was approximately 15° C. per minute. During the cooling process, the forming gas supply to the furnace was switched off at 600° C. so that the dielectric was exposed to pure nitrogen at a partial pressure of oxygen of approximately $10^{-6}$ atmospheres to reoxidize the dielectric without oxidizing the underlying nickel foil.

The fired dielectric had a thickness of about 0.8 to 0.9 micrometers. After removal from the furnace, copper electrodes varying in size from 1 mm by 1 mm to 10 mm by 10 mm were formed on the dielectric by sputtering copper through a mask. All capacitor sizes had a 83% yield. Three 10 mm by 10 mm capacitors were measured for capacitance density, dissipation factor and insulation resistance. The capacitors exhibited capacitance densities of between approximately 0.8 and 0.9 μF/cm$^2$ when measured at 0 volt. The dissipation factors were 25-30% and insulation resistance when measured at 2 volts for 2 minutes was between approximately 1×10$^2$ Ω·cm$^2$ and 4×10$^4$ Ω·cm$^2$.

As can be seen from this Comparative Example A, the absence of a sputtered BST layer on the foil leads to a low insulation resistance that is at least two orders of magnitude lower than the other examples where a BST sputtered layer was first deposited on the metal foil. In addition, the dissipation factors exhibited by the capacitors of this comparative example, were considerably higher than those of the other examples. Hence, the use of a thin, dense first dielectric layer on the metal foil deposited by PVD methods followed by a dielectric formed on the first thin, dense layer by CSD methods improves the insulation resistance and dissipation factors of capacitors versus a dielectric formed from chemical solution deposition methods alone.

What is claimed is:

1. A method of making a dielectric, the method comprising:
    forming a first dielectric layer over a metal foil by physical vapor deposition, wherein the first dielectric layer includes at least one of barium titanate or barium strontium titanate;
    forming a dielectric precursor layer by chemical solution deposition over the first dielectric layer;
    heating the dielectric precursor layer at a first temperature;
    heating the metal foil, the first dielectric layer, and the dielectric precursor layer in a low oxygen partial pressure environment at a second temperature greater than the first temperature to form a fired dielectric on the metal foil, wherein the fired dielectric includes at least one of crystalline barium titanate or crystalline barium strontium titanate; and
    after said heating the metal foil, the first dielectric layer, and the dielectric precursor layer, re-oxygenating the fired dielectric in an environment having a higher partial pressure of oxygen than the low oxygen partial pressure environment.

2. The method of claim 1, wherein the first dielectric layer is formed by sputtering.

3. The method of claim 1, wherein the metal foil is a base metal foil.

4. The method of claim 3, wherein the base metal foil comprises one or more metals selected from copper, nickel, invar, stainless steel, or alloys thereof.

5. The method of claim 1, wherein said re-oxygenating the fired dielectric is performed in an environment comprising a partial pressure of oxygen of at least $10^{-6}$ atmospheres and at a temperature between about 400 degrees Celsius and about 700 degrees Celsius.

6. The method of claim 1, wherein the thickness of the first dielectric layer is between about 0.1 micrometers and about 1.0 micrometers.

7. The method of claim 1, wherein said heating the dielectric precursor layer is conducted in a moist atmosphere comprising a reducing gas.

8. The method of claim 1, further comprising, after said heating the dielectric precursor layer, forming an additional dielectric precursor layer formed over the dielectric precursor layer.

9. The method of claim 1, wherein the dielectric precursor layer comprises at least one of barium titanate or barium strontium titanate.

10. The method of claim 1, wherein the first dielectric layer is fired at a temperature between about 400 degrees Celsius mid about 700 degrees Celsius prior to said forming dielectric precursor layer.

11. The method of claim 1, wherein said forming a dielectric precursor layer by chemical solution deposition over the first dielectric layer comprises:
coating a film of a dielectric precursor solution on the first dielectric layer; and
drying the dielectric precursor solution at a temperature between about 100 degrees Celsius and about 300 degrees Celsius until substantially all solvent in the dielectric precursor solution is removed.

12. The method of claim 1, wherein said forming a dielectric precursor layer by chemical solution deposition over the first dielectric layer comprises:
coating a first layer of a dielectric precursor solution on the first dielectric layer;
drying the first layer of the dielectric precursor solution at a temperature between bout 100 degrees Celsius and about 300 degrees Celsius to form a first dried dielectric precursor layer;
coating an additional dielectric precursor solution layer over the dried first dielectric precursor layer; and
drying the additional dielectric precursor solution layer at a temperature between about 100 degrees Celsius and about 300 degree Celsius to form an additional dried dielectric precursor layer over the first dried dielectric precursor layer.

13. The method of claim 1, further comprising, after said heating the dielectric precursor layer, forming an additional dielectric precursor layer over the dielectric precursor layer, and wherein said additional dielectric precursor layer is pre-fired at a temperature between about 350 degree Celsius and about 650 degrees Celsius in a moist reducing atmosphere.

14. A method of making a capacitor, the method comprising:
forming a first dielectric layer over a metal foil by physical vapor deposition, wherein the first dielectric layer include at least one of barium titanate or barium strontium titanate;
forming a first dielectric precursor layer by chemical solution deposition over the first dielectric layer;
heating the first dielectric precursor layer at a first temperature;
forming a second dielectric precursor layer by chemical solution deposition over the first dielectric precursor layer;
heating the metal foil, the first dielectric layer, and the dielectric precursor layer in a low oxygen partial pressure environment at a second temperature greater than the first temperature to form a fired dielectric on the metal foil, wherein the fired dielectric includes at least one of crystalline barium titanate or crystalline barium strontium titanate; and
after said heating the metal foil, the first dielectric layer, and the dielectric precursor layer, re-oxygenating the fired dielectric in an environment having a higher partial pressure of oxygen than the low oxygen partial pressure environment.

15. The method of claim 14, wherein the fired dielectric comprises dielectric material selected from crystalline barium titanate, crystalline barium strontium titanate, or combinations thereof.

16. The method of claim 14, wherein the capacitor has a capacitance density greater than $0.5\,\mu F/cm^2$ and an insulation resistance greater than $1\times10^6\,\Omega cm^2$.

17. The method of claim 16, wherein the fired dielectric has an area of at least $80\,mm^2$.

18. The method of claim 16, wherein the fired dielectric has an area of at least $400\,mm^2$.

19. The method of claim 1, wherein the first temperature is between about 350 degrees Celsius and about 650 degrees Celsius, and wherein the second temperature is between about 700 degrees Celsius and about 1200 degrees Celsius.

20. The method of claim 1, wherein said re-oxygenating the fired dielectric is performed at a third temperature that is less than the second temperature.

* * * * *